United States Patent [19]

Briggs

[11] 4,024,476
[45] May 17, 1977

[54] PROGRAMMABLE FREQUENCY DIVIDER FOR A TELEVISION RECEIVER FREQUENCY SYNTHESIZER

[75] Inventor: George Roland Briggs, Princeton, N.J.

[73] Assignee: RCA Corporation, New York, N.Y.

[22] Filed: Feb. 2, 1976

[21] Appl. No.: 654,660

[52] U.S. Cl. .............................. 325/421; 325/457; 325/468
[51] Int. Cl.² ........................................ H04B 1/16
[58] Field of Search .................. 325/418–421, 325/423, 453, 457, 459, 464, 465, 468, 470; 334/14–16; 178/5.8 AF

[56] References Cited
UNITED STATES PATENTS

| | | | |
|---|---|---|---|
| 3,845,394 | 10/1974 | Hamada | 325/464 |
| 3,913,020 | 10/1975 | Van Anrooy | 325/453 |
| 3,942,121 | 3/1976 | Bell et al. | 325/421 |
| 3,956,702 | 5/1976 | Tanaka | 325/464 |
| 3,968,444 | 7/1976 | Tenny | 325/453 |

OTHER PUBLICATIONS

IEEE Transaction on Consumer Electronics on "Simplified TV Tuning System" by Hilliker, pp. 61–68, 2-1976.

Primary Examiner—Benedict V. Safourek
Assistant Examiner—Jin F. Ng
Attorney, Agent, or Firm—Eugene M. Whitacre; Peter M. Emanuel

[57] ABSTRACT

A phase locked local oscillator loop of a frequency synthesizer tuning system for a television receiver includes a programmable frequency divider for deriving an output signal having a period which is N times the period of its input signal, N being the number in MHz of the local oscillator frequency required for tuning the receiver to a selected channel (e.g., N = 101 for U.S. channel 2). The "divide by" number N is controlled by first counting the input signal pulses in groups of (S) pulses, where (S) is a factor equal to the channel separation in MHz (6 in the U.S.). Counting by groups of S continues until the number of such groups equals the channel number, e.g., 2 for channel 2, 83 for channel 83, and then continues for an additional predetermined number of groups of S dependent on the band in which the selected channel resides. The counting then continues in groups of T (T = S-1 is usual) for another predetermined number of groups, likewise dependent on the channel band, until the correct number N of input pulses have been counted, in groups of S and T counts. When the correct N is reached, an output signal is generated and the process is repeated.

8 Claims, 10 Drawing Figures

| RANGE | BAND | CHANNEL | $f_{LO}$ MHZ | ADDED COUNT | 2 COUNT INTERVAL | R-1 COUNT | N |
|---|---|---|---|---|---|---|---|
| LOW VHF | I | 2 | 101 | 7 | "6's" | 7 | 101 |
| | | 3 | 107 | " | " | " | 107 |
| | | 4 | 113 | " | " | " | 113 |
| | II | 5 | 123 | 8 | "5's" | " | 123 |
| | | 6 | 129 | " | " | " | 129 |
| HIGH VHF | III | 7 | 221 | 22 | "6's" | " | 221 |
| | | 8 | 227 | " | " | " | 227 |
| | | 9 | 233 | " | " | " | 233 |
| | | 10 | 239 | " | " | " | 239 |
| | | 11 | 245 | " | " | " | 245 |
| | | 12 | 251 | " | " | " | 251 |
| | | 13 | 257 | " | " | " | 257 |
| UHF | IV | 14 | 517 | 58 | "5's" | 15 | 517 |
| | | 15 | 523 | " | " | " | 523 |
| | | 16 | 529 | " | " | " | 529 |
| | | ⋮ | ⋮ | ⋮ | ⋮ | ⋮ | ⋮ |
| | | 83 | 931 | " | " | " | 931 |

COUNT COMPOSITION FOR CHANNEL 6:

$$N = [(6+8) \times 6] + [2 \times 5] + [7 \times 5]$$
$$= 84 + 10 + 35 = 129$$

A COUNT, 2 COUNT, (R-1) COUNT

PROGRAMMABLE FREQUENCY DIVIDER FOR A TELEVISION RECEIVER FREQUENCY SYNTHESIZER

The present invention is directed to frequency synthesizers for television tuning apparatus and is particularly directed to programmable frequency divider circuits useful in phase locked loop types of frequency synthesizers for television tuning apparatus.

Frequency synthesizers including a phase locked loop (PLL) have been suggested to accurately generate local oscillator signals at predetermined frequencies corresponding to the various channels which a television viewer may select. For example, such apparatus is described in RCA Corporation's Digital Integrated Circuits Application Note ICAN-6716 entitled, "Low-Power Digital Frequency Synthesizer Utilizing COS/-MOS IC's" by R. E. Funk appearing in the 1972 RCA Solid State Databook on COS/MOS Digital Integrated Circuits (SSD-203).

Synthesizer tuning systems typically employ a programmable frequency divider to divide the local oscillator signal by a number (N) determined by the channel which a viewer selects. Typically, N is related by a whole number to the frequency (in MHz) of the local oscillator signal for the selected channel.

One method of programming the divider is to store the number N corresponding to each channel in a read only memory (ROM), which may be accessed in response to signals generated by a calculator type keyboard when a viewer activates the keys corresponding to the channel number. Since there may be as many as 82 channels (e.g., channels 2–13 in the VHF range and channels 14–83 in the UHF range), the ROM and addressing circuits in such a system would be quite complex.

Another method of programming the divider, described in an article entitled, "A Frequency Synthesizer for Television Receivers," by Eric G. Breeze et al. appearing in the IEEE BTR Transactions, November, 1974, takes advantage of the fact that at least in the United States, the local oscillator frequency is always an integer number of megahertz (MHZ) and the frequency separation between channels in each frequency band is regular (i.e., 6 MHz). To program the divider, input pulses to the divider are first counted until six times the channel number is reached and then are counted until an additional predetermined constant, dependent on the frequency band in which the channel resides, is counted, the total number counted being equal to the local oscillator frequency in MHz.

Phase locked loops are also known including a dual modulus divider (prescaler) which is selectively controlled to divide the frequency of an input signal by either a first number, e.g., 10, for a first predetermined number of cycles or a second number, e.g., 11, for a second predetermined number of cycles, to form an output signal whose frequency is determined by the first and second numbers of cycles. Various such arrangements, including a television VHF frequency synthesizer utilizing a dual modulus divider which is controlled to selectively divide by 10 or 12, are described at pages 101–108 of the 1973 Motorola Phase-Locked Loop Databook.

In accordance with the present invention, in a television receiver including a tuning apparatus for providing local oscillator signals allocated to frequency bands wherein local oscillator signals are separated by a predetermined frequency spacing, apparatus is provided for dividing the frequency of the local oscillator signals by respective integer numbers corresponding to the various channels and related to the local oscillator signals by an integer number. The apparatus comprises variable modulus divider means for selectively dividing the frequency of a local oscillator signal in a predetermined sequence by a first factor and a second factor in response to a control signal to provide an output signal. The first factor is directly related to the frequency separation between local oscillator signals by an integral number. The means which generates the control signal is responsive to the output signal of the variable modulus divider and causes the variable divider to divide by the first factor during a first interval for a first number of periods of the output signal, to divide by the first factor during a second interval for a second number of periods of the output signal, and to divide by the second factor during the second interval for a third number of periods of the output signal. The first number of periods is directly related to the number of the selected channel. The second and third numbers of periods are each determined by the frequency band in which the selected channel resides.

Figure 1:
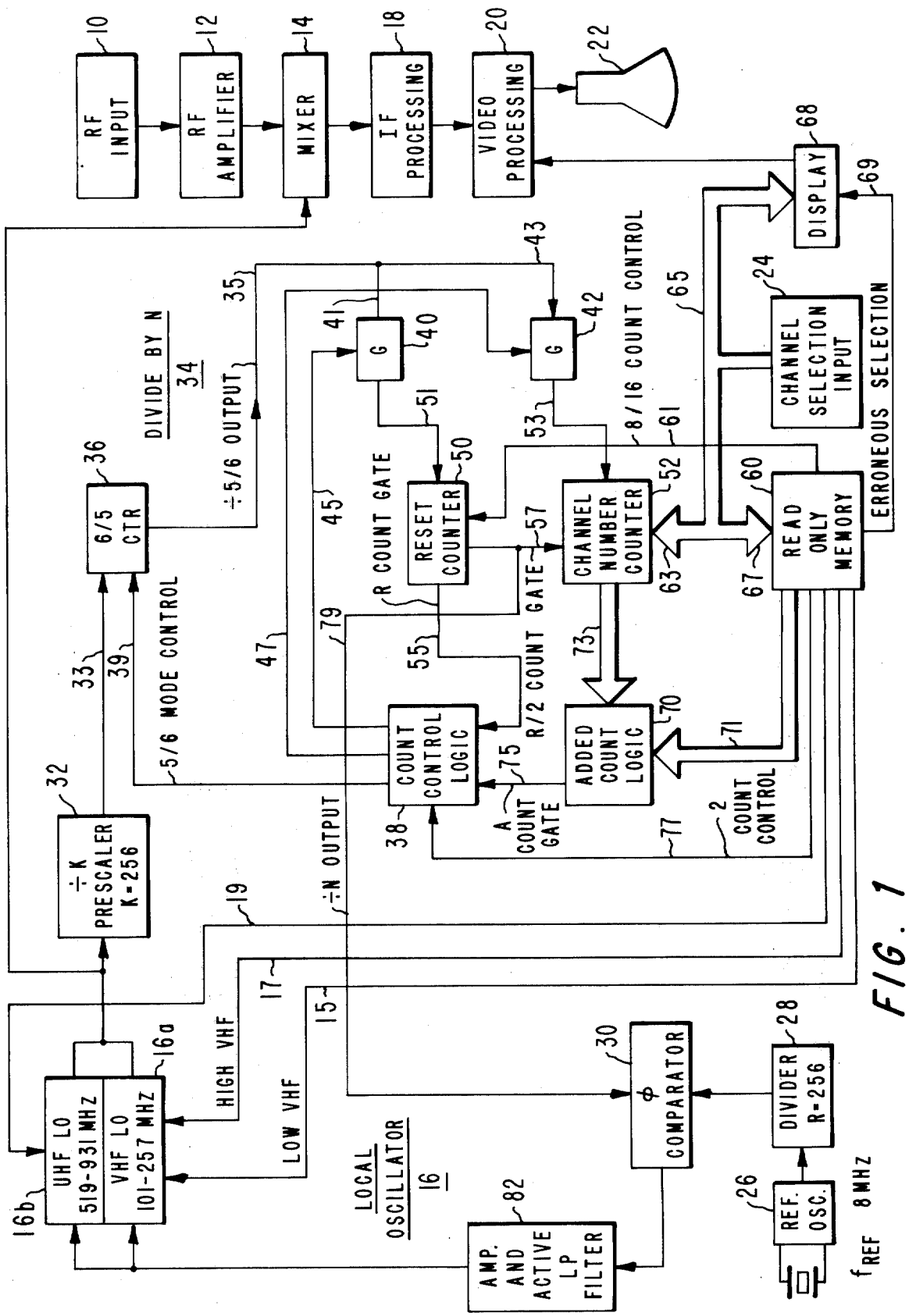
FIG. 1 shows, in block diagram form, a television receiver tuning system including a programmable frequency divider constructed in accordance with the present invention.

In the receiver of FIG. 1, radio frequency (RF) carriers bearing television information are provided at an RF input 10 which comprises, for example, a receiving antenna or a receiving antenna in combination with a cable television (CATV) distribution system. The RF carriers are amplified by an RF amplifier 12, the output of which is coupled to a mixer 14 which is also supplied with local oscillator signals by a local oscillator 16. Mixer 14 forms an intermediate frequency (IF) signal having a video or picture carrier nominally at a predetermined frequency, e.g., 45.75 MHz. The IF signal is coupled to an IF processing unit 18 where it is converted to a video output signal. The video signal is coupled to a video processing unit 20 for conversion to a form appropriate to produce an image on kinescope 22.

The system thus far described may utilize circuits such as those employed in the CTC-68 type receiver described in RCA Television Service Data 1974 No. C5, published by RCA Corporation, Indianapolis, Indiana. The remaining portion of the receiver of FIG. 1 includes a phase lock loop synthesizer comprising a reference oscillator 26, a divide by R divider 28, a phase comparator 30, an active low pass filter 32, local oscillator 16, a divide by K prescaler 32, and a programmable divide by N circuit 34. The phase lock loop configuration operates to provide a local oscillator frequency, $f_{LO}$, related to the frequency of the reference oscillator 26, $f_{REF}$, by the expression:

$$f_{LO} = \frac{NK}{R} f_{REF} \qquad (1)$$

Figures 2, 3:
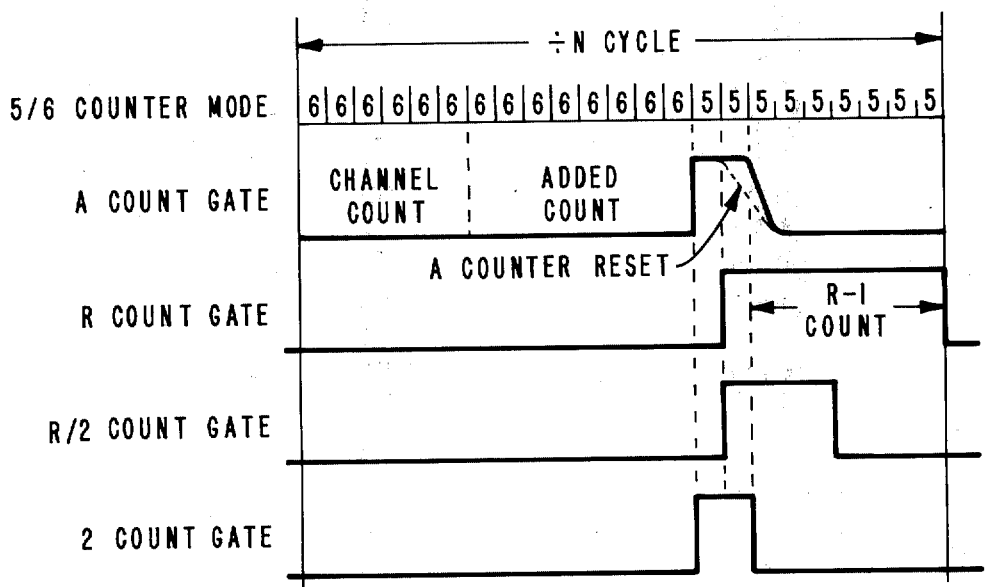
FIG. 2 shows a table related to operation of the frequency divider of FIG. 1.
FIGS. 3 and 4 show graphic representations of waveforms related to the frequency divider of FIG. 1.

The local oscillator frequencies corresponding to channels under the NTSC standards employed in the United States are listed in the table of FIG. 2. It is noted that the local oscillator frequencies may be partitioned into four bands; three bands in the VHF frequency range and one band in the UHF frequency range. Furthermore, it is noted that within each band, the local oscillator frequencies are spaced equally apart.

In the phase locked loop arrangement, prescaler 32 divides the frequency of the output of the operative one of local oscillators 16a and 16b by a factor (e.g., 256) appropriate to the operating capabilities of the remainder of the loop. Divide by N divider 34 divides the frequency of the output signal of prescaler 32 by a number related to the frequency of the local oscillator signal $f_{LO}$ by an integer number N corresponding to the selected channel. For the values of $f_{REF}$, R and K shown in FIG. 1, the values of N are shown in the table of FIG. 2 for the various channels employed in the United States.

Divide by N circuit 34, as will be later explained in greater detail, divides the frequency of its input signal provided by prescaler 32 by counting N periods (or cycles) of its input signal. The output signal of divide by N circuit 34 thus has a period equal to N times the period of its input signal. A first portion of the period of the output signal is formed by dividing the frequency of the input signal by a first factor (six) and counting the periods of the resulting signal until the number of counted periods of the resulting signal equals the number of the channel selected. The number six is chosen because, according to U.S. channel allocations, there is a 6 MHz frequency separation between channels in a given band. Since, as is shown in FIG. 2, the number N is always an odd integer, the remaining portion of the period of the output signal is formed by dividing by six and counting an additional number of periods of the resulting signal and then by dividing the frequency of the input signal by a second odd number factor (five) and counting a predetermined number of periods of the resulting signal. The additional number of 6's and the predetermined number of 5's is determined by the band in which the selected channel resides.

In order to accomplish the above-described selective division by five and six, the output of prescaler 32 is coupled to a dual modulus counter 36 via a conductor 33. Dual modulus counter 36 operates in accordance with a 5/6 MODE CONTROL signal coupled to it from a count control logic unit 38 via a conductor 39.

The output of dual modulus counter 36 is coupled to a transfer gate 40 via a conductor 41 and to a transfer gate 42 via a conductor 43. The conduction and non-conduction of transfer gates 40 and 42 are controlled by signals coupled from a count controls logic unit 38 to transfer gates 40 and 42 via conductors 45 and 47, respectively. The output of transfer gate 40 is coupled to a reset counter 50 via a conductor 51 while the output of transfer gate 42 is coupled to a channel number counter 52 via a conductor 53.

Reset counter 50 is a dual modulus counter which selectively divides the frequency of input signals provided on conductor 51 either by 8 or 16 in response to an 8/16 COUNT CONTROL signal coupled to it from a read only memory (ROM) 60 via a conductor 61. An R COUNT GATE pulse having a duration equal to either 8 or 16 (depending on the 8/16 COUNT CONTROL signal) periods of the input signal provided via conductor 51 is coupled to count control logic 38. An R/2 COUNT GATE pulse, whose duration is equal to one half the duration of the R COUNT GATE pulse, is coupled to channel number counter 52 via a conductor 57. The R/2 COUNT GATE pulse is also coupled to phase comparator 30 via a conductor 79 as the output signal of divide by N circuit 34. Signals representing a most significant digit (MSD) and a least significant digit (LSD) of a selected channel number are coupled in BCD (binary coded decimal) format to channel number counter 52 via a multiple conductor path 63 from a channel selection input 24 which may, for example, comprise a calculator type keyboard and logic for converting two-digit decimal numbers into BCD signals. One suitable channel selection arrangement is described in U.S. Pat. No. 3,947,773, entitled, "Channel Number Memory for Television Tuners," by Don Edward Christensen, filed Jan. 17, 1974, and assigned to the same assignee as the present invention.

The BCD signals provided by channel selection input 24 are also coupled via a multiple conductor path 65 to a display unit 68 which may be of a type suitable for coupling to video processing unit 20 so that channels selected by a viewer are displayed on the screen of kinescope 22. Such an on-the-screen display system is described in U.S. Pat. No. 3,984,828, entitled, "Character Generator for Television Channel Number Display," by Billy Wesley Beyers, Jr., filed May 23, 1975, and assigned to the same assignee as the present invention.

The BCD signals provided by channel selection input 24 are also coupled to ROM 60 via a multiple conductor path 67. ROM 60 stores pre-set control information and converts such information to control signals in response to the BCD signals provided by channel selection input 24. Three of these control signals are coupled to local oscillator 16 to control its frequency in accordance with the selected channel. For channels 2–6, VHF portion 16a of local oscillator 16, in response to an enable signal coupled to it via a conductor 15, provides local oscillator signals in the frequency range between 101 and 129 MHz. For channels 7–13, VHF portion 16a of local oscillator 16, in response to an enable signal coupled to it via a conductor 17, provides local oscillator signals in the frequency range between 221 and 257 MHz. For channels 14–83, UHF portion 16b of local oscillator 16, in response to an enable signal coupled to it via a conductor 19, provides local oscillator signals in the frequency range between 517 and 931 MHz. The local oscillator enable signals are also coupled to switches (not shown) within local oscillator 16 to couple the output of the appropriate local oscillator portion to mixer 14 and divide by K prescaler 32 in accordance with the frequency range of the selected channel.

ROM 60 also provides a signal indicating when an erroneous or an "illegal" channel has been selected by a viewer. In the United States, channels 0 and 1 and any channel above 84 are designated as erroneous selections. If a viewer selects one of these channels, a signal is coupled from ROM 60 to display 68 via a conductor 69 to indicate to the viewer that he has selected an unused channel.

ROM 60 also couples coded signals representing predetermined "added count" numbers, depending on which band the selected channel is in, to an added count logic unit 70 via a multiple conductor path 71. Added count logic unit 70 is also coupled to channel number counter 52 via a multiple conductor path 73. Added count logic unit 70, under the control of ROM 60, processes the signals provided by counter 52 to determine when channel number counter 52 has counted a preset additional number of cycles of the output signal of dual modulus counter 36 beyond the number equal to the channel number. When the additional number of cycles has been counted, logic unit 70 generates an A COUNT GATE signal which is coupled to count control logic unit 38 via a conductor 75.

ROM 60 also couples a 2 COUNT CONTROL signal to count control logic unit 38 via a conductor 77. This signal is also derived in accordance with the band in which the selected channel is located.

Divide by N circuit 34 will now be described by way of example where the selected channel is channel 6. Reference should also be made to FIG. 3 in which various waveforms associated with the divide by N circuit 34 are shown when the selected channel is six.

When the viewer selects the decimal number six by depressing, for example, a zero followed by a six on a keyboard, channel selection input 24 generates corresponding BCD signals which are coupled to channel number counter 52. The BCD signals are entered into the registers forming channel number counter 52 when, as will be explained below, an R/2 COUNT GATE signal is generated by reset counter 50. At that time, the BCD signals corresponding to 06 are entered or "jammed" into channel number counter 52.

In addition, as will be explained below, an R COUNT GATE signal generated by reset counter 50 is coupled to count control logic 38. A counting sequence begins when, in response to the termination of the R COUNT GATE signal, count control logic 38 provides a mode control signal to counter 36 to cause it to divide by 6 and, at the same time, generates control signals to render transfer gate 40 nonconductive and transfer gate 42 conductive. The output of dual modulus counter 36 is thereby decoupled from reset counter 50 and is coupled to channel number counter 52. Channel number counter 52 is therefore supplied during this period with a signal whose frequency is one-sixth the frequency of the output signal of divide by K prescaler 32.

Channel number counter 52 is decremented once in response to each six pulses of the output signal of dual modulus counter 36 until counter 52 reaches zero. At this point, since BCD signals representing the channel number were initially entered in counter 52, six times the channel number of pulses of the output signal of divide by K prescaler 32 have been counted.

Channel number counter 52 thereafter continues to count downwardly by sixes for an "added" or additional number of counts which, in binary format, corresponds to counting downward from the maximum number which may be stored in counter 52. The additional number of counts (herein designated by the symbol A) is controlled by the coded signals coupled to added count logic unit 70 from ROM 60. The number A is selected in accordance with the band in which the selected channel resides and is indicated in the table of FIG. 2 for the various U.S. channels. When channel number counter 52 indicates that A cycles of 6's have been counted, an A COUNT GATE signal is generated by added count logic 70. Thus, at this point, in accordance with the table of FIG. 2, for channel 6, six cycles of 6's for the channel selected have been counted, and, in addition, eight cycles of 6's for the added count number A have been counted.

In response to the A COUNT GATE signal and a 2 COUNT CONTROL signal provided by ROM 60, count control logic unit 38 either causes dual modulus counter 36 to continue to divide by 6 or to cause it, thereafter, to divide by 5. Whether dual modulus counter 36 divides by 6 or 5 at this point is determined in accordance with the band in which the selected channel resides. For channel 6, count control logic unit 38 responds to the 2 COUNT CONTROL signal to cause dual modulus counter 36 to divide by 5 rather than 6. Two cycles of 5's then are counted after the generation of the A COUNT GATE signal.

After the first of the two cycles of 5's is counted, count control logic unit 38 causes transfer gate 40 to be conductive and transfer gate 42 to be nonconductive, thereby coupling output pulses from dual modulus divider 36 to reset counter 50 and decoupling such pulses from channel number counter 52. In response to the first pulse (cycle) coupled to reset counter 50, the R COUNT GATE and the R/2 COUNT GATE signals become logic 1's. One pulse thereafter, count control logic 38 causes dual modulus divider 36 to divide by 5 (if it has not already been caused to so during the 2 COUNT GATE signal as will be pointed out below).

Thereafter, a predetermined number (R-1) of cycles of 5's are counted. The number of cycles of 5's counted during this reset interval is controlled by reset counter 50 in response to the 8/16 COUNT CONTROL signal generated by ROM 60, again in accordance with the band of the selected channel. As will be noted from the table of FIG. 2, in the VHF bands (Channels 2–13) the latter number of 5's to be counted is seven and therefore reset counter 50 is caused to count eight counts; remembering that when dual modulus counter 36 was caused to divide by 5, in response to the R COUNT GATE signal becoming a logic 1, reset counter 50 had already counted one cycle during the 2 COUNT GATE signal. Thus, for channel 6, seven additional cycles of 5's are counted after the initiation of the R COUNT GATE signal. It should be noted that, in the UHF range (channels 14–83), the final number of 5's to be counted is fifteen (sixteen minus one).

The R/2 COUNT GATE signal, which is coupled to channel number counter 52, has a duration equal to ½ the duration of the R COUNT GATE signal. This is sufficiently long to permit the BCD numbers from input 24 to be entered and stored by channel number counter 52 as was noted at the outset of this explanation.

At the end of the reset interval, the divide by N cycle is complete since one pulse, for example, the R/2 COUNT GATE pulse, has been produced for N cycles of the output signal of divide by K prescaler 32. As is shown below the waveforms of FIG. 3, the count composition for channel 6 is made up of 84 + 10 + 35 for a sum of 129 (the frequency in MHz of the local oscillator signal for that channel).

It should be noted from FIG. 2 that the "2 count interval" may involve dividing by five or by six depending on the band in which the selected channel lies.

Figure 5:
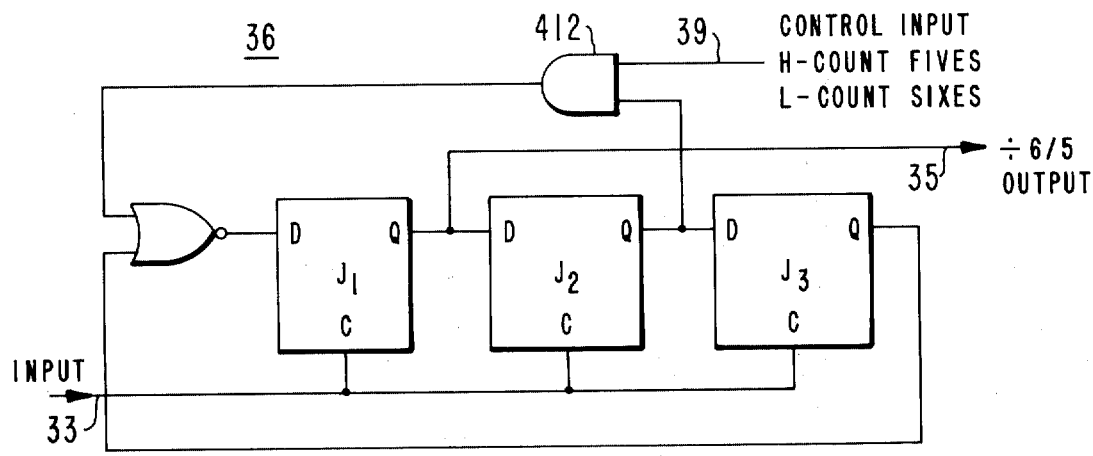
FIG. 5 shows a logic implementation of the dual modulus counter of FIG. 1.

In FIG. 5, there is shown an implementation of dual modulus counter 36 comprising a known Johnson counter. The three D-type flip-flops ($J_1$, $J_2$, $J_3$) may be CD4013 COS/MOS integrated circuits manufactured by the RCA Corporation. When a logic 0 (L) is applied from count control logic unit 38 to conductor 39, the output of the third stage ($J_3$) of the Johnson counter is coupled to the input of the first stage ($J_1$) via NOR 414 and the counter divides the input frequency at conductor 33 by 6. When a logic 1 (H) is applied to "AND" gate 412, the output of the second stage of the Johnson counter is also coupled to the input of the first stage via NOR 414 and the combined signal causes the Johnson counter to divide the frequency of the input signal by 5.

Figure 6:
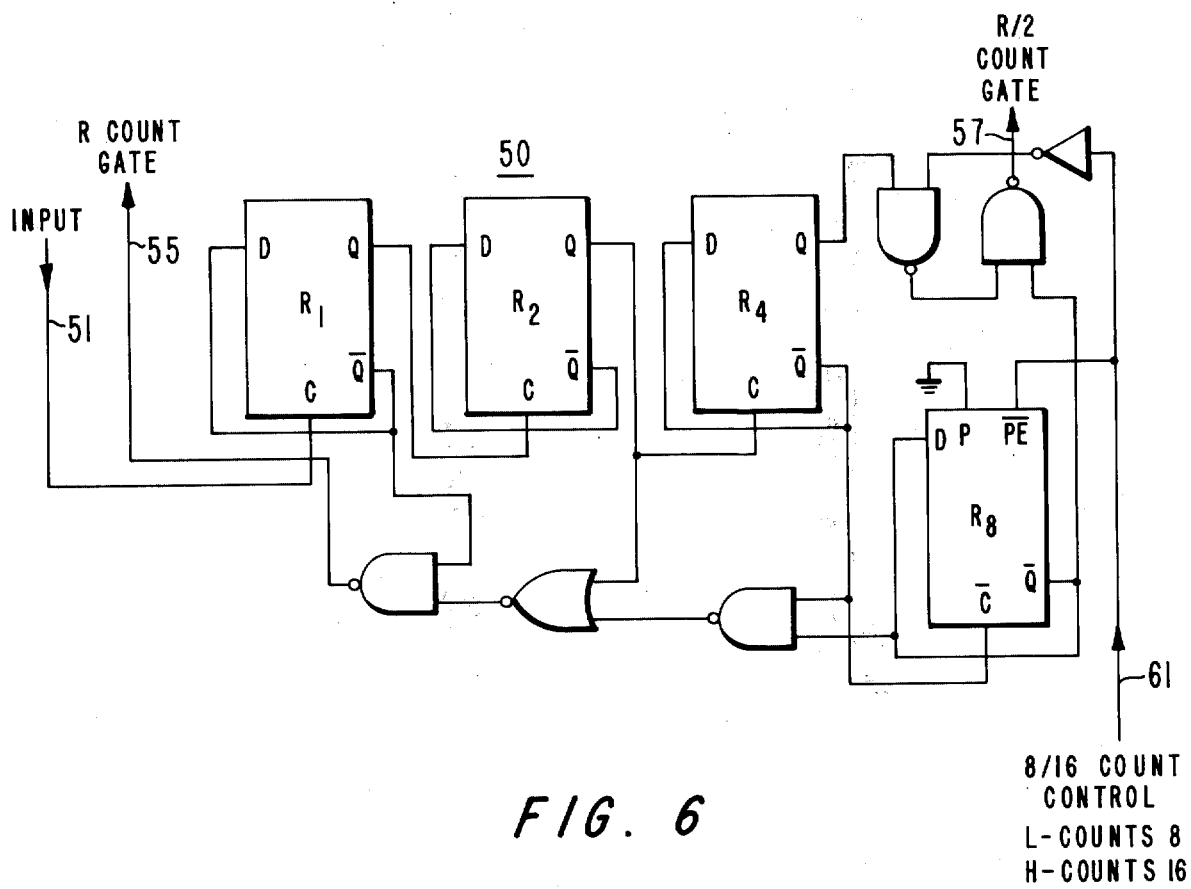
FIG. 6 shows a logic implementation of the reset counter of FIG. 1.

In FIG. 6, there is shown a logic implementation of reset counter 50 using three clocked D-type flip flops (R1, R2 and R4) and a programmable D-type flip-flop (R8). The D-type flip-flops each may comprise a CD4013 COS/MOS integrated circuit and the programmable flip-flop may comprise a CD4029 COS/MOS integrated circuit both manufactured by the RCA Corporation. When a logic 0 is applied to conductor 61, reset counter 50 divides the frequency of input signals on conductor 51 by 8. When a logic 1 is applied to conductor 61, reset counter 50 divides the frequency of the input signal on conductor 51 by 16. In response to the application of input pulses at conductor 51 from transfer gate 40, the output (R COUNT GATE) of reset counter 50 at conductor 55 is set to a logic 1. When reset counter 50 has counted 8 or 16 pulses, depending on the 8/16 COUNT CONTROL signal at conductor 61, the R COUNT GATE is set to a logic 0. The R/2 COUNT GATE output signal at conductor 57 has a duration equal to one-half the duration of the R COUNT GATE signal. It is noted that because reset counter 50 of FIG. 6 is a binary counter which counts down from either 8 or 16 to 0, the end of the reset portion (i.e., the termination of the R COUNT GATE pulse) may simply be determined by "and" type logic which examines the output signals of the flip-flops comprising reset counter 50 to detect when they are all logic 0's.

Figure 7:
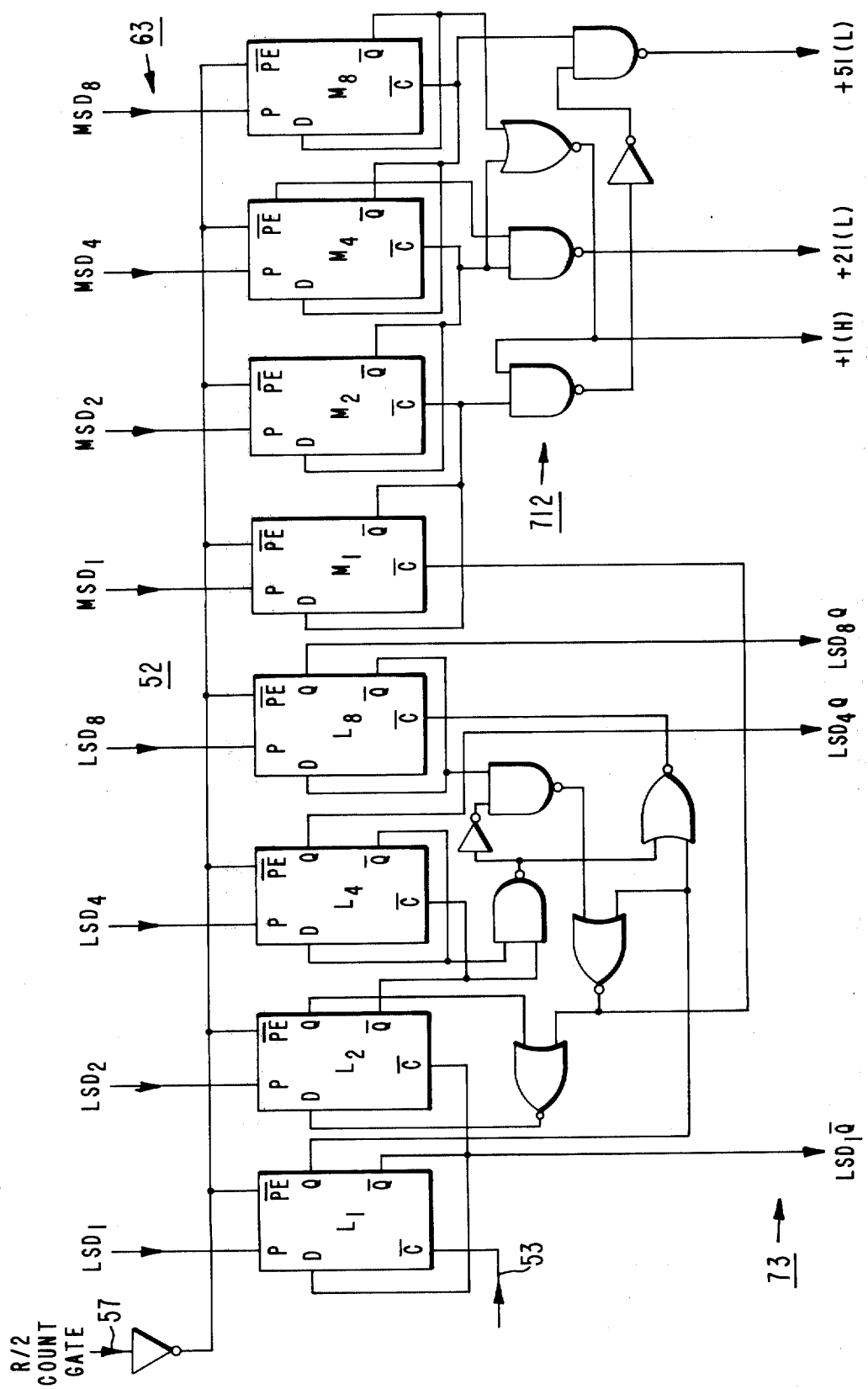
FIG. 7 shows a logic implementation of the channel number counter of FIG. 1.

In FIG. 7 there is shown a logic implementation of channel number counter 52 utilizing programmable D-type flip-flops such as CD4029 COS/MOS integrated circuits manufactured by the RCA Corporation and conventional logic gate elements. The counter is partitioned into a least significant digit (LSD) stage comprising flip-flops $L_1 L_2$, $L_4$ and $L_8$ and a most significant digit (MSD) stage comprising flip-flops $M_1$, $M_2$, $M_4$ and $M_8$. Each stage is ripple clocked. The LSD stage is arranged as a decade counter because it is required to repeatedly count by tens. The MSD stage is arranged as a binary counter because it must provide 15 operating states (from BCD 0 to BCD 8 for the channel count portion of the divide by N cycles and from BCD 9 to BCD 15 for the added count portion of the divide by N cycle).

The LSD and MSD BCD signals provided by channel selection input 24 are coupled to respective P (programming) inputs of the D-type programmable flip-flops and entered in response to the application of the R/2 COUNT GATE signal to the PE (program enable) inputs. Channel number counter 52 counts down from the number entered in response to each clock pulse provided via conductor 53 until it reaches BCD 0. At a count of BCD 0, channel number counter 52 has counted a number of input pulses equal to the channel number. Thereafter, in response to each clock pulse, channel number counter 52 counts additional cycles of the input signal.

Combinational logic network 712 is responsive to the outputs of the MSD stage and determines when an added count of either +1, +21 or +51 has been reached. The outputs of the combinational logic network 712 are coupled with the signals developed at the Q, and Q outputs of the one, four and eight LSD stages, respectively, to added count logic unit 70 via multiple conductor path 73.

Figure 8:
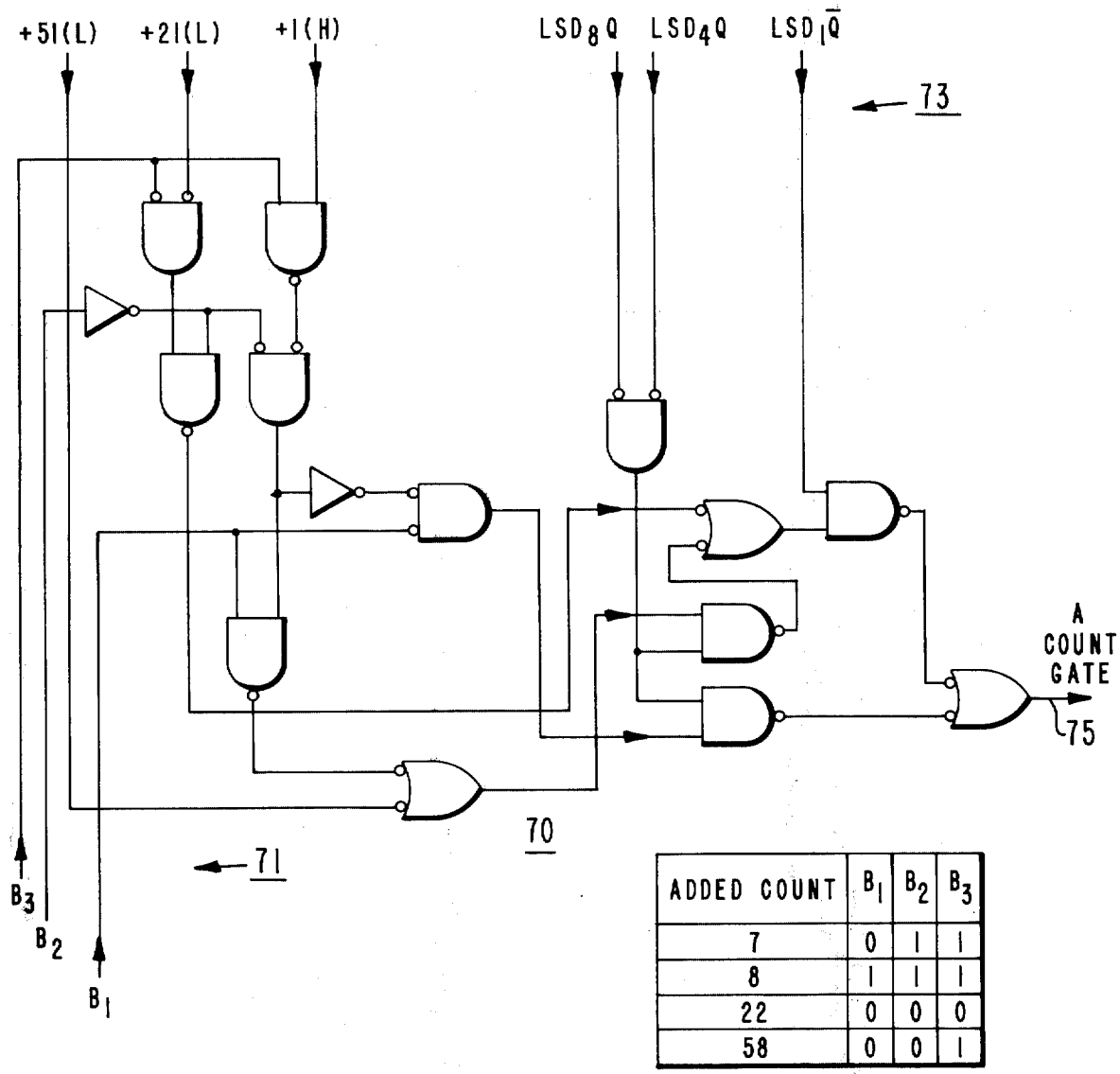
FIG. 8 shows a logic implementation of the added count logic unit of FIG. 1.

In FIG. 8, there is shown a combinational logic network implementing added count logic unit 70. In addition to the signals provided via conductor path 73 from channel number counter 52, three input signals labelled $B_1$, $B_2$ and $B_3$ are also received via multiple conductor path 71 from ROM 60. Added count logic unit 70 serves to generate the A COUNT GATE signal on conductor 75 when the output signals of the flip-flop comprising the LSD stage of channel number counter 52 (shown in FIG. 7) indicates that an additional number of counts plus the counts previously detected by logic network 712 (of FIG. 7) equal the total number of added counts required for the particular band, as are represented by signals $B_1$, $B_2$ and $B_3$. In FIG. 8 there is also shown a table indicating the required added counts and binary values of $B_1$, $B_2$ and $B_3$ for these counts.

Figure 4:
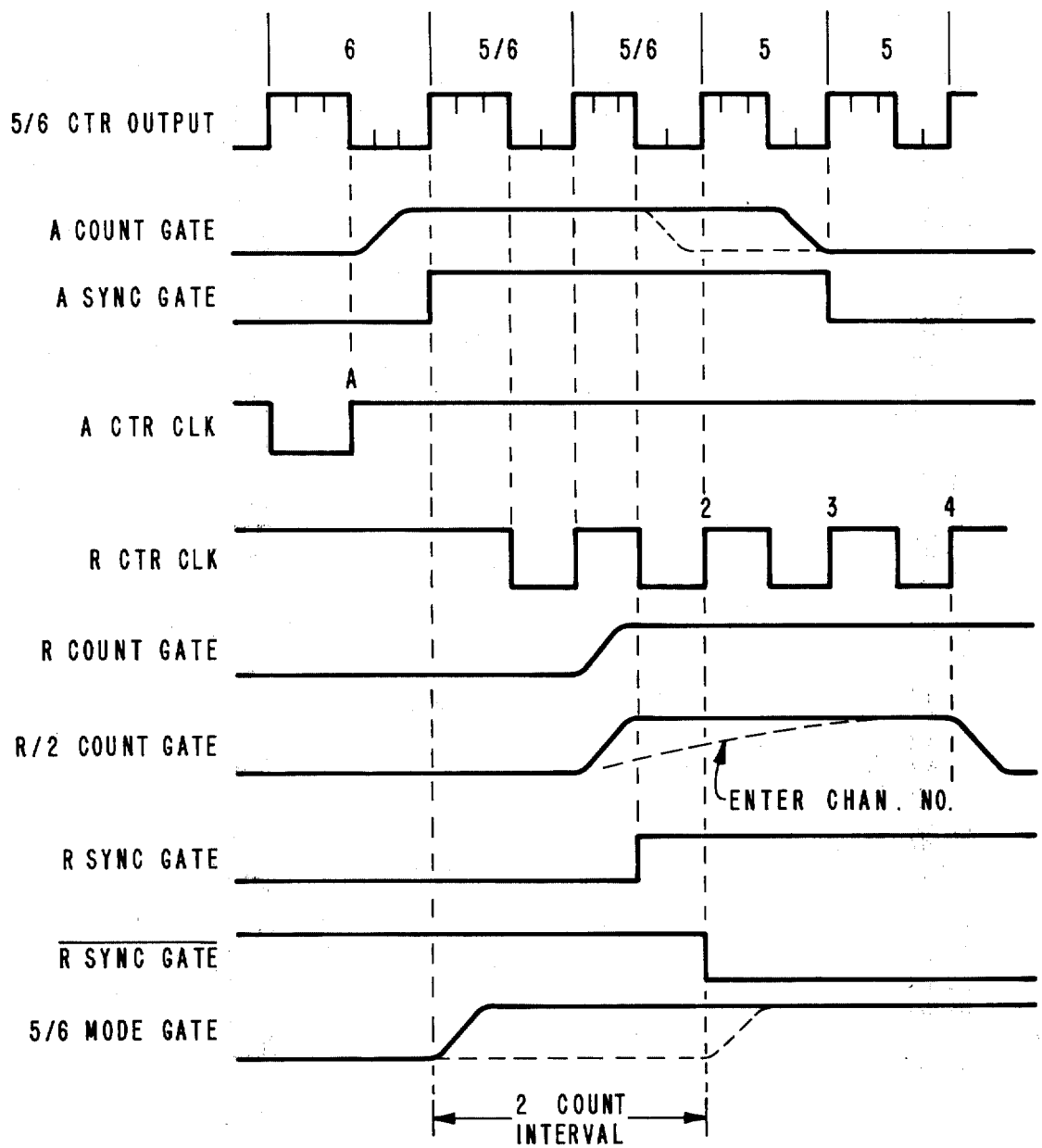
Figure 9:
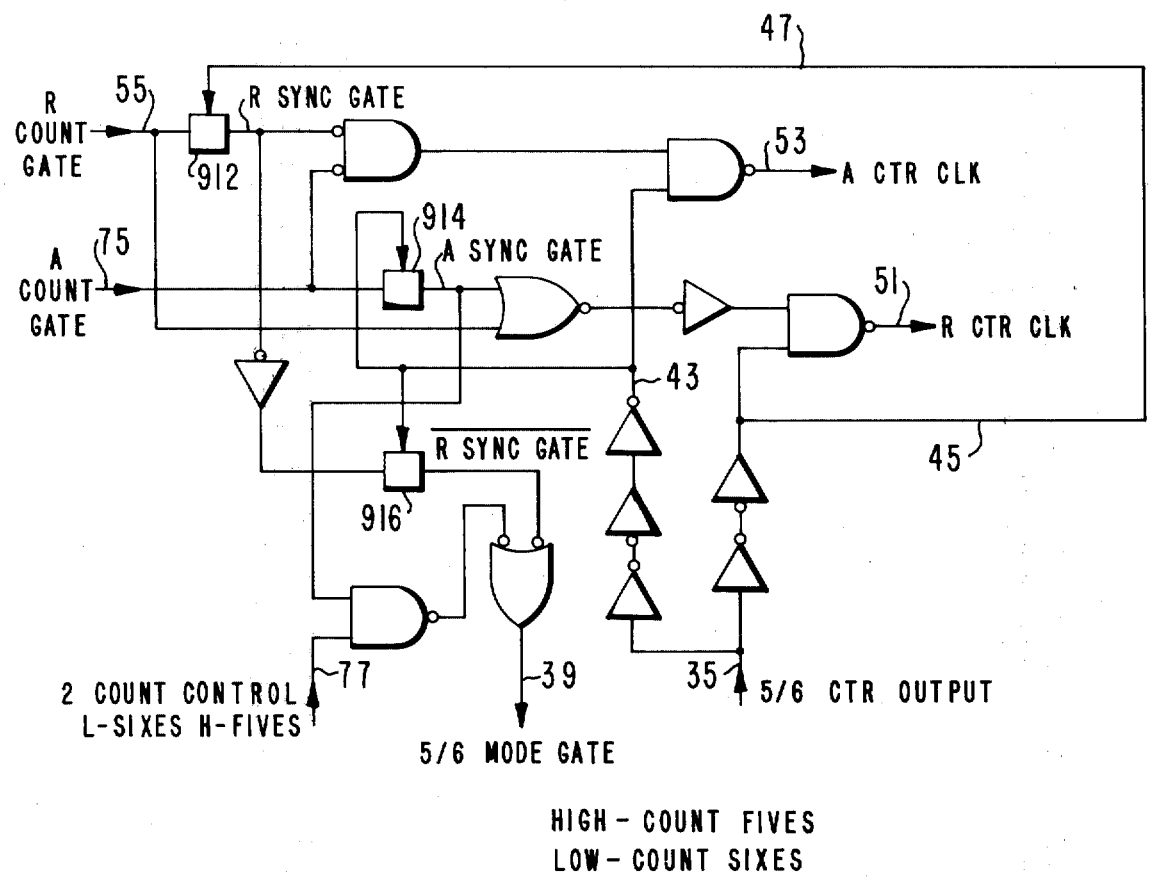
FIG. 9 shows a logic implementation of the count reset logic unit of FIG. 1.

In FIG. 9, there is shown a logic implementation including count control logic unit 38 and transfer gates 40 and 42 utilizing conventional logic elements. Logic switches 912, 914 and 916 direct the application of clock pulses provided by dual modulus counter 36 to either reset counter 50 or channel number counter 52. These switches may comprise those of the type included in the CD4016A COS/MOS integrated circuit Quad bilateral switch package (including four switches) manufactured by the RCA Corporation. Count control logic 38 of FIG. 9 may best be understood by reference to FIG. 4 which shows various input, output and internal waveforms associated with count control logic unit 38.

Figure 10:
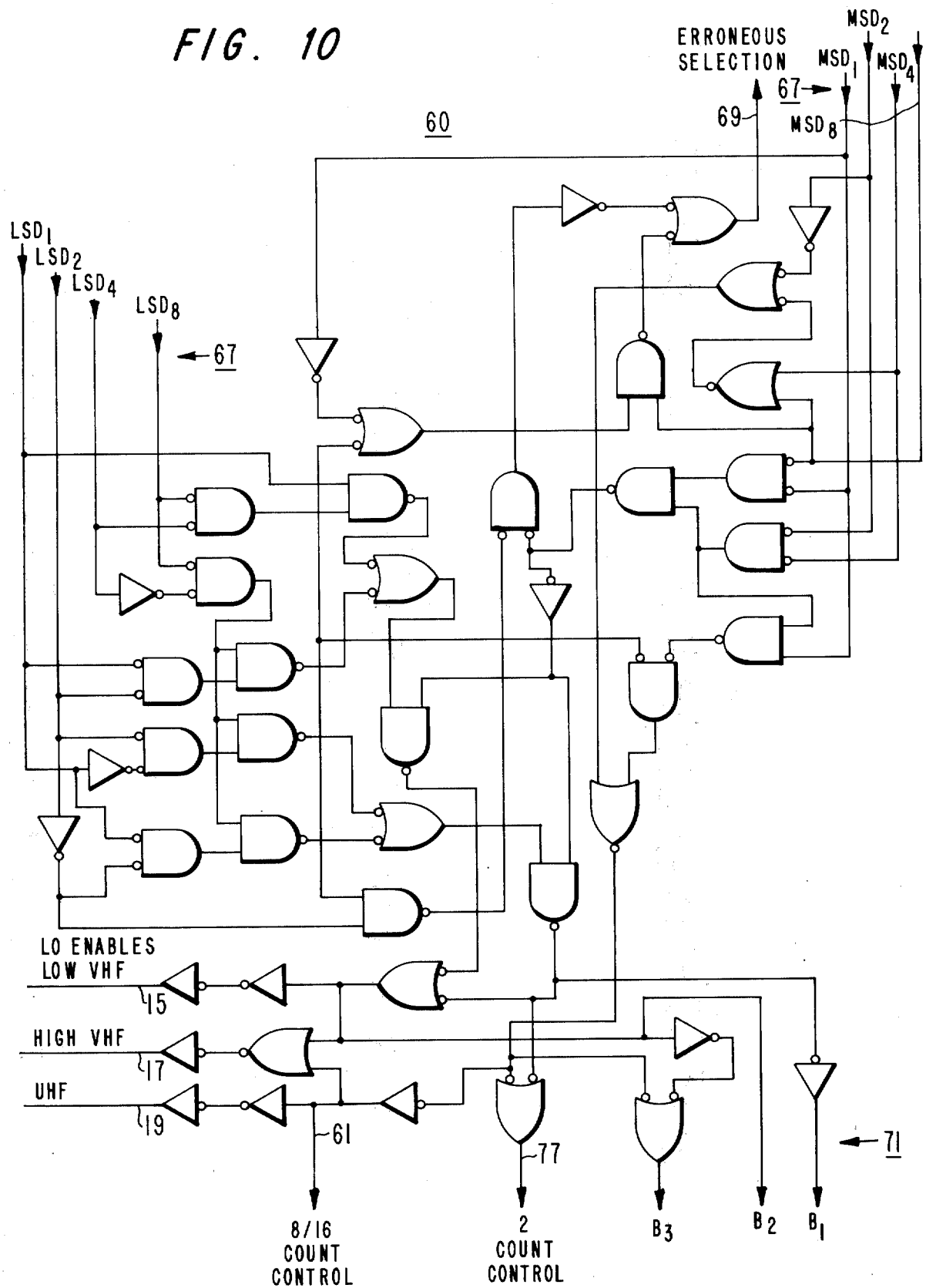
FIG. 10 shows a logic implementation of the read only memory of FIG. 1.

In FIG. 10 there is shown a logic implementation of ROM 60. Since its function in terms of input and output signals has already been described in detail and its structure comprises standard combinational logic, a detailed description of its internal operation will not be given.

Although the present invention has been described in terms of the specific embodiment of FIG. 1 and although specific implementations of portions of the embodiment have been described, it should be appreciated that modifications may be made which are within the scope of the invention.

What is claimed is:

1. In a television receiver including a tuning apparatus for providing a plurality of local oscillator signals respectively corresponding to a plurality of channels a viewer may select, each of said local oscillator signals being allocated to one of at least two frequency bands wherein it is separated from an adjacent channel by a predetermined frequency spacing, an apparatus comprising:

variable modulus divider means for selectively dividing the frequency of a local oscillator signal by first and second factors in response to a control signal to provide an output signal, said first factor being directly related to said frequency separation between local oscillator signals by an integral number; and means for generating said control signal to cause said variable modulus divider means to divide by said first factor during a first interval for a first number of periods of said output signal, to divide by said first factor during a second interval for a second number of periods of said output signal, and to divide by said second factor during said second interval for a third number of periods of said output signal, said first number of periods being directly related to the number of said selected channel, said second and third numbers of periods each being related to the frequency band of said selected channel.

2. The apparatus recited in claim 1 wherein said means for generating said control signal comprises a read only memory arrangement.

3. The apparatus recited in claim 2 wherein said read only memory arrangement provides said control signal in response to a selected channel number.

4. The apparatus recited in claim 3 wherein said read only memory arrangement comprises an arrangement of logic gates having a selected channel number as the only information input.

5. The apparatus recited in claim 1 wherein the one of said first and second factors is an even number and the other is an odd number.

6. The apparatus recited in claim 5 wherein the first factor is an even number.

7. The apparatus recited in claim 6 wherein the frequencies of said local oscillator in at least one of said bands is an integral multiple of six and wherein said first factor is an integral multiple of six.

8. The apparatus recited in claim 7 wherein said second factor is an integral multiple of five.

* * * * *